United States Patent
Bernstein et al.

(10) Patent No.: US 6,462,585 B1
(45) Date of Patent: Oct. 8, 2002

(54) HIGH PERFORMANCE CPL DOUBLE-GATE LATCH

(75) Inventors: Kerry Bernstein, Underhill; Edward Jospeh Nowak, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 09/788,924

(22) Filed: Feb. 20, 2001

(51) Int. Cl.$^7$ .............................................. G01R 19/00
(52) U.S. Cl. ............................. 327/55; 327/65; 327/89; 327/199; 365/189.05; 365/207
(58) Field of Search ............................. 327/51, 55, 52, 327/57, 65, 67, 78, 89, 96, 197, 199, 214–219, 563; 365/189.05, 190, 196, 205, 207, 208, 154, 156; 257/338, 350

(56) References Cited

U.S. PATENT DOCUMENTS

| | | | | |
|---|---|---|---|---|
| 4,438,351 A | * | 3/1984 | Schuermeyer | 257/289 |
| 4,825,100 A | | 4/1989 | Caspell | 327/208 |
| 4,956,815 A | * | 9/1990 | Houston | 365/154 |
| 5,057,898 A | | 10/1991 | Adan et al. | 257/369 |
| 5,307,142 A | | 4/1994 | Corbett et al. | 365/156 |
| 5,780,899 A | | 7/1998 | Hu et al. | 257/335 |
| 6,060,919 A | * | 5/2000 | Wilson et al. | 327/143 |

FOREIGN PATENT DOCUMENTS

FR  2 724 472  3/1996

OTHER PUBLICATIONS

Fuse, T., et al., "0.5V SOI CMOS Pass–Gate Logic", IEEE International Solid–State Circuits Conference, pp. 88–89, 1996.
Wann, C., et al., "Channel profile optimization and device design for low–power high–performance dynamic–threshold MOSFET", IEEE/IEE Electronic Library, Electron Devices Meeting, 1996, International, pp. 113–116, Dec. 1996.
Wann, C., et al., "Channel Profile Optimization and Device Design for Low–Power High–Performance Dynamic–Threshold MOSFET", IBM T.J. Watson Research Center, Yorktown Heights, New York 10598, 1996.
"Dual–Gate CMOS Logic", IBM Technical Disclosure Bulletin, vol. 25, No. 8, Jan. 1983.

* cited by examiner

Primary Examiner—Timothy P. Callahan
Assistant Examiner—Minh Nguyen
(74) Attorney, Agent, or Firm—Scully, Scott, Murphy & Presser; Richard A. Henkler

(57) ABSTRACT

A differential circuit to be used as a latch-up for asymmetric-double-gate complementary metal oxide semiconductor (DGCMOS) devices. The differential circuit includes an asymmetric-DGCMOS device having the weak gates tied to input circuitry and strong gates that are used in cross-coupling.

9 Claims, 3 Drawing Sheets

HIGH PERFORMANCE CPL DOUBLE-GATE LATCH

DESCRIPTION

1. Field of the Invention

The present invention relates to asymmetric-double-gate complementary metal oxide semiconductor (DGCMOS) devices, and more particularly to an asymmetric-DGCMOS device wherein a cross-coupled latch is employed which substantially reduces body-to-source/drain parasitic capacitances as well as structural body resistance parasitics of the asymmetric-DGCMOS device. The inventive DGCMOS device design provides a lower power, higher performance DGCMOS device than heretofore possible with prior art DGCMOS devices.

2. Background of the Invention

Asymmetric-double-gate complementary metal oxide semiconductor (DGCMOS) technology is considered to be the leading candidate to extend high-performance CMOS technology beyond 0.1 μm lithography and below 1.0 V power supply. Asymmetric-double-gate MOSFET (See, for example, T. Tanaka, et al., "Ultrafast Low-Power Operation of a p+-n+Double-Gate SOI MOSFETS", 1994 Symposium on VLSI Technology Digest of Technical Papers, pp. 11–12) consists of a fully depleted double-gate MOSFET in which the two gate electrodes consist of dissimilar conductors, typically n+ and p+ doped polysilicon. A typical prior art asymmetric-double-gate device is shown, for example, in FIGS. 1A and 1B. Since the two electrodes have differing Fermi levels, one of the two electrodes will prove more attractive to the channel inversion layer, when formed, and thus will exert stronger control of the conduction channel. The electrode which proves more attractive to the inversion carriers is referred to as the "strong"0 gate and the electrode which proves less attractive is referred to as the "weak"0 gate.

Conventional CMOS circuits in DGCMOS technology gain from increased effective $V_{dd}/V_t$ ratio due to the ideal sub-threshold swing and improved short-channel $V_t$ control compared to conventional CMOS. It is noted that the term "$V_{dd}$" is used herein to denote the power supply voltage of the device, whereas the term "$V_t$" denotes the threshold voltage of the device. Despite the above-mentioned improvements, the effective $V_{dd}/V_t$ ratio of prior art DGCMOS devices must degrade with $V_{dd}$ scaling. Various attempts to further improve the effective $V_{dd}/V_t$ ratio of DGCMOS devices to limits that are within conventional scaling expectations have been developed. One such attempt is disclosed, for example, in Fuse, et al., "0.5V SOI CMOS Pass-Gate Logic", Slide Supplement for the 1996 IEEE International Solid-State Circuits Conference, Page 71. Specifically, the Fuse, et al. publication discloses a DGCMOS design wherein a variant on dynamic threshold CMOS (DTCMOS) technology is employed. Specifically, the Fuse, et al. publication provides a DTCMOS design where the gates of the nFETs (field effect transistors) are connected to the bodies of the latch pFETs. The input-body connection scheme employed in Fuse, et al. is shown in FIGS. 2–3. This prior art scheme includes an inverter with cross-coupled pull-up pMOSFETs. FIG. 2 illustrates a prior art connection scheme without body-bias controlling, while FIG. 3 shows a prior art connection scheme with body-bias controlling. In each of FIGS. 2 and 3, reference numeral 10 is used to represent pMOSFETs, reference numeral 12 is used to represent an inverter, and reference numerals 14 and 16 are used to denote the point at which cross-coupling between adjacent pMOSFETs occurs.

Dynamic threshold complementary metal oxide semiconductor (DTCMOS) circuits, such as illustrated above and further described in the Fuse, et al. publication, unfortunately suffer from inherent body-to-source and body-to-drain parasitic capacitances as well as structural body resistance parasitics. These parasitics cause an undesirable increase in the gate input capacitance of the device since all the body of the MOSFET serves as a gate electrode. Moreover, in prior art DTCMOS devices, the source and drain regions are only isolated from the switched body by silicon depletion regions that have a high dielectric constant (on the order of about 11.7) associated therewith. A detailed discussion concerning the drawbacks associated with dynamic threshold CMOS circuits can be found, for example, in C. Wann, et al., "Channel Profile Optimization and Device Design for Low-Power High-Performance Dynamic-Threshold MOSFET", IEDM 96-113.

Due to the above-mentioned disadvantages of the DTCMOS devices, the use of these devices to improve the effective $V_{dd}/V_t$ ratio presents significant shortcomings for power and delay reductions with $V_{dd}$ scaling (reduction); therefore alternative solutions for improving effective $V_{dd}/V_t$ ratio without causing any substantial body-to-source or body-to-drain parastic capacitances nor body parastic resistances are needed. Such a solution may lead to extending high-performance CMOS technology beyond 0.1 μm lithography and below 1.0 V power supply ranges.

SUMMARY OF THE INVENTION

One object of the present invention is to provide a cross-coupled latch circuit which can be used with an asymmetric-double-gate device.

A further object of the present invention to provide a cross-coupled latch circuit that improves the effective $V_{dd}/V_t$ ratio of an asymmetric-double-gate device to a value that is within current scaling expectations.

A yet further object of the present invention is to provide a cross-coupled latch circuit that improves the effective $V_{dd}/V_t$ ratio without causing any substantial body-to-source/drain parasitic capacitances or structural body resistance parasitics.

An even further embodiment of the present invention is to provide a differential circuit design for use with an asymmetric-double-gate complementary metal oxide semiconductor (DGCMOS) device which provides a high performance device that may be scalable below about 0.1 μm, while being able to operate at voltages below about 1 V.

These and other objects and advantages are achieved in the present invention by providing a differential circuit wherein asymmetric-double-gate CMOS devices are wired with both of the nFET gates tied to the input and one of the pFET (double) gates also tied to the input. The inventive circuit allows the pFET drive to vary on a desirable fashion for speed and stability. Moreover, the inventive differential circuit improves the effective $V_{dd}/V_t$ ratio of the device, without causing any substantial body-to-source/drain parasitic capacitances or structural body resistance parasitics. Additionally, the inventive circuit design provides a high performance asymmetric-DGCMOS device that may be scalable below about 0.1 μm, yet is able to operate at voltages below about 1 V.

Specifically, the present invention provides a differential circuit which comprises an asymmetric-double-gate device containing a pair of series coupled pFETs and nFETs, each pFET and nFET having weak gates and strong gates associated therewith, wherein the weak gates of the nFETs and the pFETs are tied to input circuitry, and the strong gates of said pFETs are used for cross-coupling.

The inventive circuit design provides a lower power and higher performance device that can be easily integrated into present DGCMOS technology.

DETAILED DESCRIPTION OF THE INVENTION

As stated above, the present invention broadly provides a differential circuit which comprises an asymmetric-double-gate device containing a pair of series coupled pFETs and nFETs, each pFET and nFET having weak gates and strong gates associated therewith, wherein the weak gates of the nFETs and the pFETs are tied to input circuitry, and the strong gates of the pFETs are used for cross-coupling. The inventive circuit is shown, for example, in FIG. 4 of the present invention.

Figure 1A:
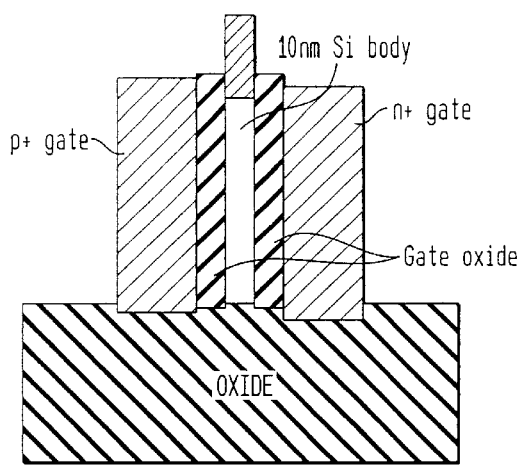
FIGS. 1A (side view) and 1B (top view) are pictorial representations of a prior art asymmetric-double-gate device.
Figure 1B:
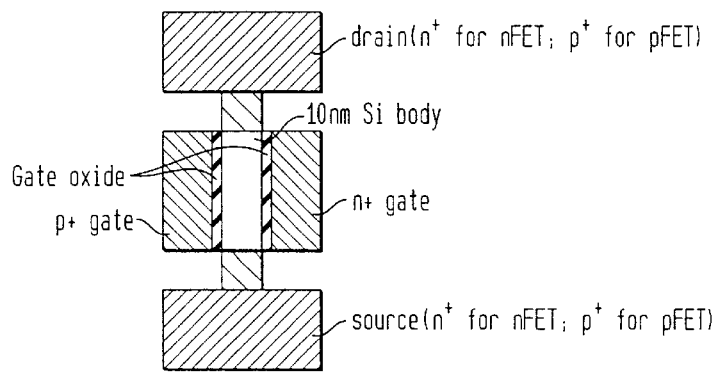
Figure 1B:
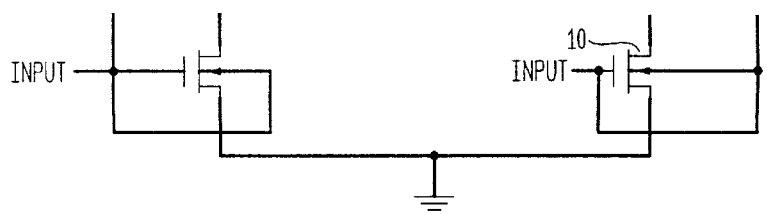
Figure 2:
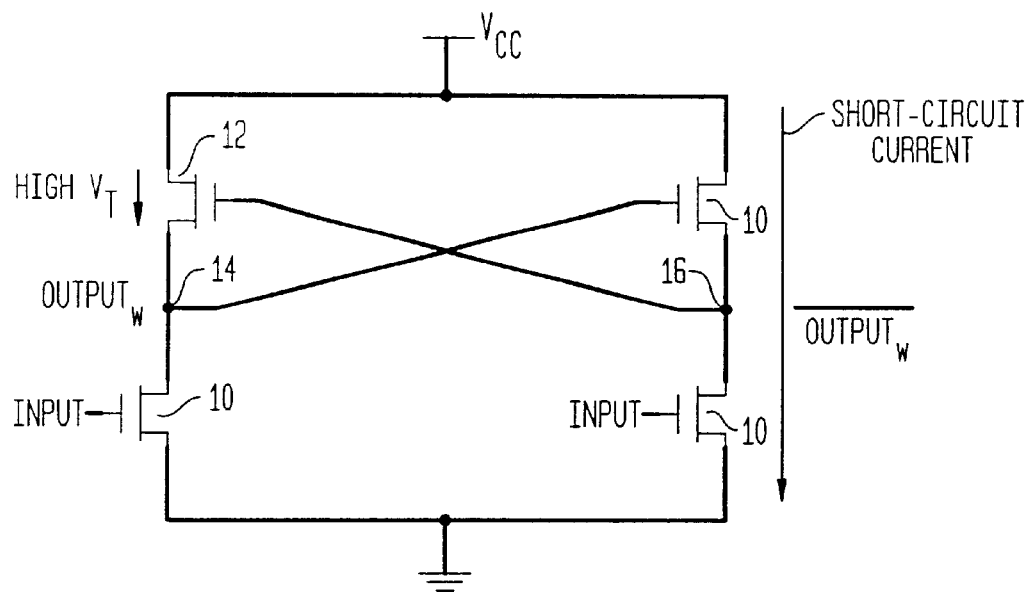
FIG. 2 is a circuit diagram of a prior art input-body connection scheme without body-bias coupling, as described in the Fuse, et al. publication mentioned hereinabove.
Figure 3:
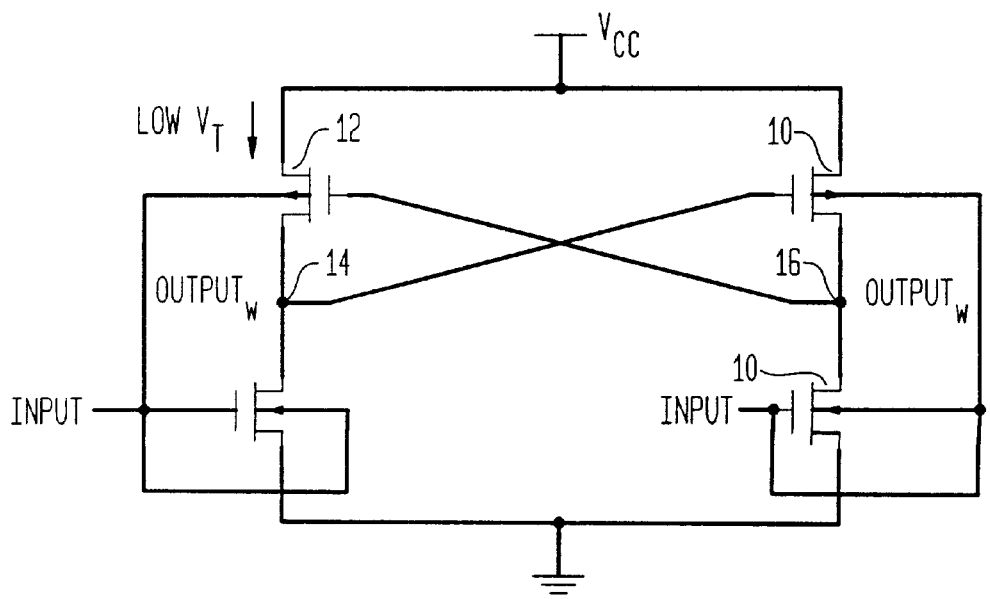
FIG. 3 is a circuit diagram of a prior art input-body connection scheme without body-bias coupling, as described in the Fuse, et al. publication mentioned hereinabove.
Figure 4:
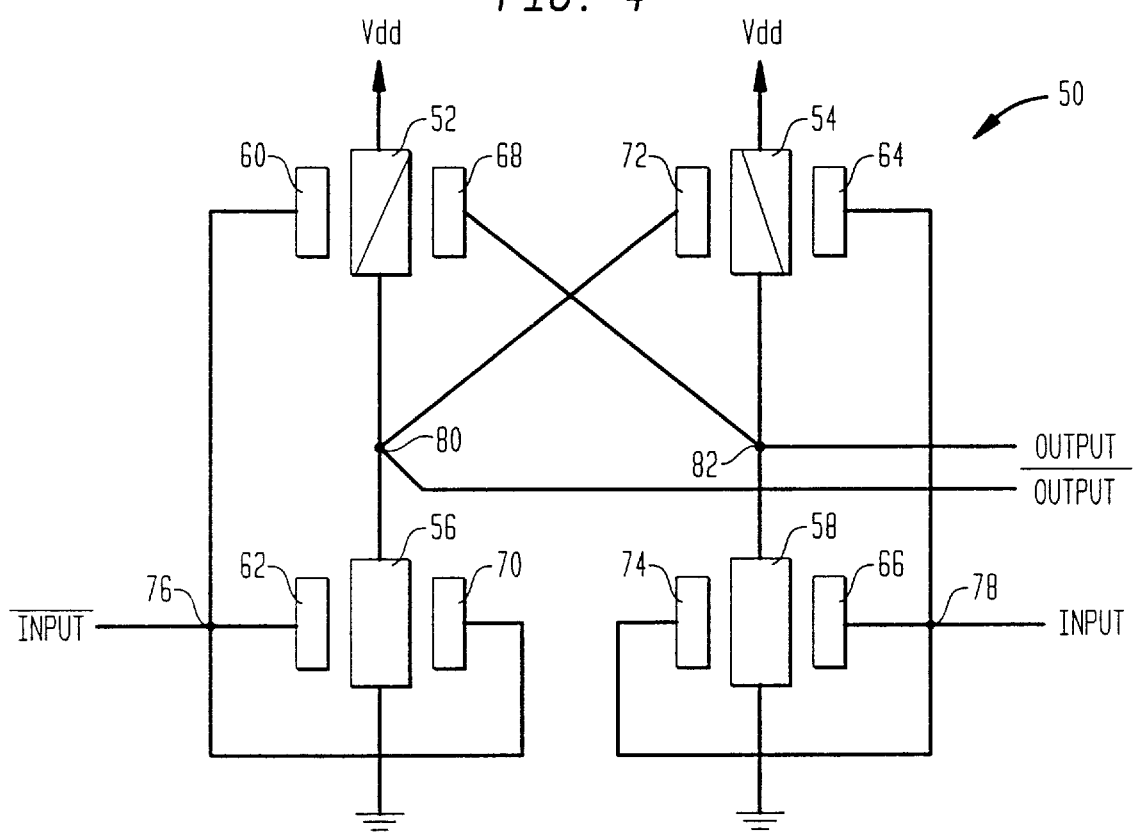
FIG. 4 is a circuit diagram of the inventive differential circuit of the present invention wherein the weak gates of the asymmetric-DGCMOS device are tied to input circuitry and the strong gates of the pFETs of the DGCMOS device are employed for cross-coupling.

Specifically, FIG. 4 is a schematic diagram of inventive differential circuit 50 which includes pFET 52 tied in series to nFET 56 and pFET 54 tied in series to nFET 58. Both series coupled pFET and nFET form a DGCMOS device. As is shown in FIG. 4, each pFET is also coupled to a $V_{dd}$ power supply and each nFET is coupled to ground, Gnd. Moreover, in the illustrated circuit, each pFET and nFET includes a weak gate (60, 62, 64 and 66) and a strong gate (68, 70, 72 and 74).

The term "weak gate" is used herein to denote a gate of a FET (pFET or nFET) which has less influence on the FET channel portion by virtue of its less attractive (to the channel carriers) Fermi level with respect to the "strong gate", which, in turn, has a greater influence on the FET channel potential by virtue of its more attractive Fermi level (to the channel carriers). Specifically, and as shown in FIG. 4, the gates facing outward (e.g., the right gates of the right hand side FETs and the left gates of the left hand side of the FETs) are the weak gates of the differential circuit. The strong gates, on the other hand, are those gates that are on found in the interior region of the circuit between the two pair of series coupled nFETs and pFETs (e.g., the left gates of the right hand side FETs and the right gates of the left hand side FETs). It is noted that the above design is a feature uniquely suited to asymmetric-DGCMOS devices and suffers significant disadvantages with DTCMOS devices.

In differential circuit 50, the weak gates of the FETs, i.e., 60, 62, 64 and 66, are tied up to input circuitry which is referenced in FIG. 4 by the term "Input". The strong gates of the nFETs are coupled to the corresponding weak gate of the pFET as well as the input circuitry. That is, strong gate 70 of nFET 56 is coupled to weak gate 60 of pFET 52 and strong gate 74 of nFET 58 is coupled to weak gate 64 of pFET 54. In FIG. 4, reference numerals 76 and 78 represent the nodes wherein the weak gates (60, 62, 64 and 66) and strong gates (70 and 74) are coupled to the input circuitry.

Insofar as strong gate 66 of pFET 52 and strong gate 72 of pFET 54 are concerned, those strong gates are used as a cross-coupled latch as shown in FIG. 4. Specifically, strong gate 66 of pFET 52 is cross-coupled to the adjacently coupled pFET and nFET through node 82, whereas strong gate 72 of pFET 54 is cross-coupled to the adjacently coupled pFET and nFET through node 80. Nodes 80 and 82 lead to output regions which are labeled simply as "output" in FIG. 4.

It is noted that in the above-described differential circuit, the $V_t$ of each pFET is substantially modified by the input state. When 'input' is high, then the right hand side pFET has high $V_t$ and the left hand side pFET has low $V_t$ (since input is low). Moreover, the inventive differential circuit provides an improvement over the prior art DTCMOS solution described in the Fuse, et al. publication mentioned above because the DTCMOS solution of the prior art intrinsically has a much higher gate input capacitance than the inventive circuit since all the body serves as a gate electrode in DTCMOS. The increased capacitance obtained using the DTCMOS circuit disclosed in Fuse, et al. is caused by the source and drain being isolated from the switched body by silicon depletion regions having a dielectric constant of about 11.7, See, for example, the article to C. Wann, et al. mentioned supra.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A differential circuit which comprises an asymmetric-double-gate device having a pair of series coupled pFETs and nFETs each of the pFETs and nFETs having a weak gate and a strong gate associated therewith, wherein the weak gates of the nFETs and the pFETs are tied to input circuitry, and the strong gates of said pFETs are used for cross-coupling.

2. The differential circuit of claim 1 wherein each of said nFETs is further coupled to ground.

3. The differential circuit of claim 1 wherein each of said pFETs is further coupled to a power supply source.

4. The differential circuit of claim 1 wherein the strong gates of said nFETs are coupled to the input circuitry.

5. The differential circuit of claim 1 wherein each of the strong gates of said nFETS are coupled to the weak gates of the associated pair of series coupled pFETs and nFETs.

6. The differential circuit of claim 1 wherein said cross-coupling occurs at a node on an adjacently series coupled pFET and nFET.

7. The differential circuit of claim 1 wherein said device is scalable to below 0.1 $\mu$m.

8. The differential circuit of claim 1 wherein said device operates at a voltage of below 1 V.

9. The differential circuit of claim 1 wherein said cross-coupling leads to output circuitry.

* * * * *